(12) United States Patent
Parker

(10) Patent No.: US 6,424,566 B1
(45) Date of Patent: Jul. 23, 2002

(54) PROGRAM RECONNAISSANCE TO ELIMINATE VARIATIONS IN VT DISTRIBUTIONS OF MULTI-LEVEL CELL FLASH MEMORY DESIGNS

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/779,864

(22) Filed: Feb. 8, 2001

(51) Int. Cl.$^7$ ............................................... G11C 16/00
(52) U.S. Cl. ................................................. 365/185.03
(58) Field of Search ........................ 365/185.03, 185.22, 365/185.24, 185.28, 168

(56) References Cited

U.S. PATENT DOCUMENTS 6,219,276 B1 * 4/2001 Praver ................... 365/185.03
6,301,151 B1 * 10/2001 Engh et al. ............ 365/185.03

*Primary Examiner*—Tan T. Nguyen

(57) ABSTRACT

A method of programming a memory cell that has $2^N$ voltage levels where N>1 and represents the number of bits stored within the memory cell. The method includes setting a target number T of programming pulses for programming each of $2^N-1$ vt levels of the memory cell, applying $T*(2^N-1)$ programming pulses to the memory cell and determining when the highest one of the $2^N-1$ vt levels is programmed. If it is determined that the highest one of the $2^N-1$ vt levels is programmed by a number M of programming pulses that is less than the target number T, then compensating the programming speed of those ones of said $T*(2^N-1)$th number of programming pulses subsequent to the Mth programming pulse.

13 Claims, 8 Drawing Sheets

PROGRAM RECONNAISSANCE TO ELIMINATE VARIATIONS IN VT DISTRIBUTIONS OF MULTI-LEVEL CELL FLASH MEMORY DESIGNS

BACKGROUND OF THE INVENTION

1. Field of the Invention

The present invention relates to the field of non-volatile memory devices. More particularly, the invention relates to a method of programming multi-bit flash electrically erasable programmable read only memory (EEPROM) cells that utilize the phenomena of hot electron injection to trap charge within a trapping dielectric material within the gate.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory.

Flash EEPROMs are similar to EEPROMs in that memory cells can be programmed (i.e., written) and erased electrically but with the additional ability of erasing all memory cells at once, hence the term flash EEPROM. A Flash device is a non-volatile memory comprising an array of cells that can store a pre-determined number of logic "0"'s and "1"'s. The stored "1"'s and "0"'s maintain their state in the absence of external power. These bits can be modified millions of times over the life-time of the device.

An example of a typical configuration for an integrated circuit including a multi-level cell flash memory array 100 and circuitry enabling programming, erasing, and reading for memory cells in the array 100 is shown in FIG. 1. The flash memory array 100 includes individual cells 102. Each cell 102 has a drain connected to a bitline 104, each bitline being connected to a bitline pull up circuit 106 and column decoder 108. The sources of the array cells are connected to Vss, while their gates are each connected by a wordline 109 to a row decoder 110.

The row decoder 110 receives voltage signals from a power supply 112 and distributes the particular voltage signals to the wordlines as controlled by a row address received from a processor or state machine 114. Likewise, the bitline pull up circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines 104 to sense amplifiers or comparators 116 as controlled by a column address signal received from processor 114. The sense amplifiers 116 further receive voltage reference signals from reference 118. The outputs from sense amplifiers 116 are then provided through data latches or buffers 120 to processor 114.

As mentioned above, the memory array 100 includes multi-level storage cells 102. Multi-level storage refers to the ability of a single memory cell 102 to represent more than a single binary bit of data. A conventional memory cell depicts two states or levels, usually referred to as logic "0" and logic "1". A multi-level cell could represent as many as 256 states, or a byte of information.

Multi-level cell storage is obtainable in flash design because a flash memory cell can be programmed to provide multiple threshold voltage (vt) levels. The different vt levels can be sustained over time in a flash memory cell 102, even after repeated accesses to read data from the cell. For example, 16 vt levels stored in a flash memory cell can represent data in four conventional memory cells. Thus, an array of multi-level flash memory cells 102 which can store up to 16 vt levels can provide 4 times the storage capacity of conventional memory cells which only store a binary bit per cell. An example of a multi-level memory array is discussed in U.S. Pat. No. 5,973,958, the entire contents of which are incorporated herein by reference.

Programming of the flash memory array 100 is executed on a word-line basis. The word-line 109 is considered the row address. The word-line will cross multiple bit-lines 104. The bit-line 104 is considered the column address. Each bit-line 104 contains buffer logic to interface to the selected core cell during program, read and erase operations.

FIG. 2 illustrates a selected and unselected bit-line during programming. The unselected bit (bit not to be programmed) is considered inhibited. The bit-line is inhibited from the effects of the program pulse. The selected bit (bit to be programmed) is referred to as uninhibited. This bit will be programmed during the program pulse.

To program a multi-level cell in the flash memory array 100, high gate-to-drain voltage pulses are provided to the cell from power supply 112 while a source of the cell is grounded. For instance, during programming typical gate voltage pulses of 18V are each applied to a cell, while a drain voltage of the cell is set to 3.3V and its source is grounded.

As shown in FIG. 2, the program voltage PVpp of 18V will be applied to the selected word-line (column address). A substantially lesser voltage, such as 10V, will be applied to unselected word-lines. An uninhibited word-line will have a strong field generated across the device. In particular, FIG. 2 shows that with Vss of 0V being applied to one end of a bit-line 109 to be uninhibited, the source/drain regions of the bit-line will couple to 0V or ground. This will make the applied field appear much stronger so that effective programming can occur. A high field generated across the memory device will cause electron injection into the floating gate of the selected cell exponentially proportional to strength of the field. This programming procedure results in an increase of a threshold voltage for the cell, the threshold being the gate-to-source voltage required for the cell to conduct.

Each programmed cell requires a specific amount of applied electric field to obtain the desired programmed vt level. The amount of electric field determines the program speed of a bit-cell. Fast cells will need less applied field while slow cells will need more. The electric field is applied through several program pulses. The use of program pulses allows the device to control program distributions. After each pulse, the cells are program-verified to see if the target vt has been achieved. Using multiple program pulses allows the device to stop programming fast bits while completing the programming the slow bits.

An inhibited word-line will not have a strong field across the device. FIG. 2 shows that with VCC of 3.3V being applied at one end of a bit-line 109 to be inhibited, the source/drain regions of bit-line will couple to 8V. This will make the applied field appear much weaker and no effective programming will occur.

As explained above, a multi-level cell 102 utilizes $2^N$ VT levels to represent N logical bits. Standard program times of multi-level cell designs are $2^N-1$ times that of a single bit program time (SBPT). An example of known programming of two logical bits (N=2) in a single multi-level cell 102 is shown in FIG. 3. In particular, four programming charge distributions A, B, C and E are formed. The centers of the programming charge distributions A–C are preferably positioned between the centers of the charge distributions for the reading pulses. The centers of the charge read distributions are labeled RdA, RdB and RdC corresponding to Read Level A, Read Level B and Read Level C, respectively. RdA typically has a value of approximately 0V, RdB a value of approximately 800 mV and RdC a value of approximately 1.6V. Besides wanting the centers of the program distributions A–C to be positioned between Read Levels A–C, it is desired that there be no intersection between the programming and read distributions so that the read process can accurately predict the levels of the memory cell are properly programmed.

Table 1 is given below that shows a preferred correspondence between the levels A–C and E and the accessed logical bit values Q1, Q2.

TABLE 1

| Level | Vt      | Q2 | Q1 |
|-------|---------|----|----|
| C     | 2.0 V   | 0  | 0  |
| B     | 1.0 V   | 0  | 1  |
| A     | 0 V     | 1  | 0  |
| E     | < -2.0 V | 1  | 1  |

Since charge distribution E is the erase state and considered the default setting, there are $2^N-1$ levels or in the case of N=2 three levels A–C ($2^2-1$) that must be programmed depending on loaded data. In a known manner of programming, each of the $2^2-1$ levels are programmed separately. Each level is programmed separately so that the inhibited and uninhibited bit-lines can be set. This separate programming results in the total programming time being equal to $(2^N-1)*SBPT$ (single bit program time). As N, the number of logical bits increases, the programming time becomes exponentially larger and more burdensome. For example, a 4-bit (N=4) multi-level cell design can have a programming time that is $2^4-1$ times greater than that of a 2-bit multi-level cell design. Accordingly, there is a need for reducing the programming time for multi-level cells that are programmed for multiple bits.

It should be kept in mind that the cell program speed will vary for a variety of reasons. Bit-cell variations within the population of memory cells due to process issues can cause even neighboring cells to program differently under the same conditions. Program speed can be dependent on the applied voltage. Bit-cells program speed will track VCC, high VCC—faster programming. A bit-cell's programming characteristics will also change over its own lifetime. A bit-cell will both speed-up and slow-down over the millions of cycles it will encounter. All these factors have a direct effect on the program margins and, thus, need to be controlled.

FIG. 4 illustrates the effect of faster programming on the program vt distribution of FIG. 3. Faster programming generates fewer program pulses since the program distribution's target windows widen when compared with the program distribution of FIG. 3 represented by dotted pulses. Fewer pulses limit the control on program accuracy since the program margins between consecutive pulses are reduced.

FIG. 5 illustrates the effect of slower programming on the program vt distribution of FIG. 3. Slower programming generates more program pulses since the program distribution's target windows shrink when compared with the program distribution of FIG. 3 represented by the dotted pulses. The added pulses will improve accuracy. Slower programming affects performance but not program margins or reliability in a multilevel cell design.

To erase a cell in the flash memory array 100, the programming process described above is reversed. In the case of N=2, the highest level vt level C is erased by applying pulses of 20V to the substrate while the gate is grounded.

To read the state of a cell, a typical control gate voltage of Rd levels is applied to the cell. The current output from the cell being read is received at an input of a number of the sense amplifiers 116 connected to the same bitline as the cell being read. A second input to each sense amplifier is provided from the reference 118. The reference 118 provides a different reference current to each sense amplifier connected to a bit line, with a current level set equal to current expected from a cell being read when programmed to a desired threshold voltage state. Binary outputs of the sense amplifiers 116 indicate if the cell being read is in a state that is greater than or less than the state of the reference signal received. Outputs of the sense amplifiers are provided through data latch/buffers 120 to the processor 114, enabling the processor 114 to determine from the sense amplifier outputs the threshold state of the cell being read.

SUMMARY OF THE INVENTION

One aspect of the present invention regards a method of programming a memory cell that has $2^N$ voltage levels where N>1 and represents the number of bits stored within the memory cell. The method includes setting a target number T of programming pulses for programming each of $2^N-1$ vt levels of the memory cell, applying $T*(2^N-1)$ programming pulses to the memory cell and determining when the highest one of the $2^N-1$ vt levels is programmed. If it is determined that the highest one of the $2^N-1$ vt levels is programmed by a number M of programming pulses that is less than the target number T, then compensating the programming speed of those ones of said $T*(2^N-1)$ number of programming pulses subsequent to the Mth programming pulse.

A second aspect of the present invention regards a method of programming a multi-level cell flash memory array that has individual multi-level memory cells each having $2^N$ voltage levels where N>1 and represents the number of bits stored within the memory cell and wherein each of the individual memory cells includes a drain connected to a bitline, a source connected to a voltage source Vss and a gate connected to a wordline. The method includes setting a target number T of programming pulses for programming each of $2^N-1$ vt levels of one of the individual multi-level memory cells and uninhibiting only a bitline corresponding to a voltage level of the one of the individual multi-level memory cells. Applying $T*(2^N-1)$ programming pulses to the uninhibited bitline, determining when the highest one of the $2^N-1$ vt levels is programmed. If it is determined that the highest one of the $2^N-1$ vt levels is programmed by a number M of programming pulses that is less than the target number T, then compensating the programming speed of those ones of the T*($2^N$–1) number of programming pulses subsequent to the Mth piggyback pulse.

Each of the above aspects of the present invention provide the advantage of providing consistent programming distributions and program performance over many device conditions.

The present invention, together with attendant objects and advantages, will be best understood with reference to the detailed description below in connection with the attached drawings.

DETAILED DESCRIPTION OF THE INVENTION

Figure 1:
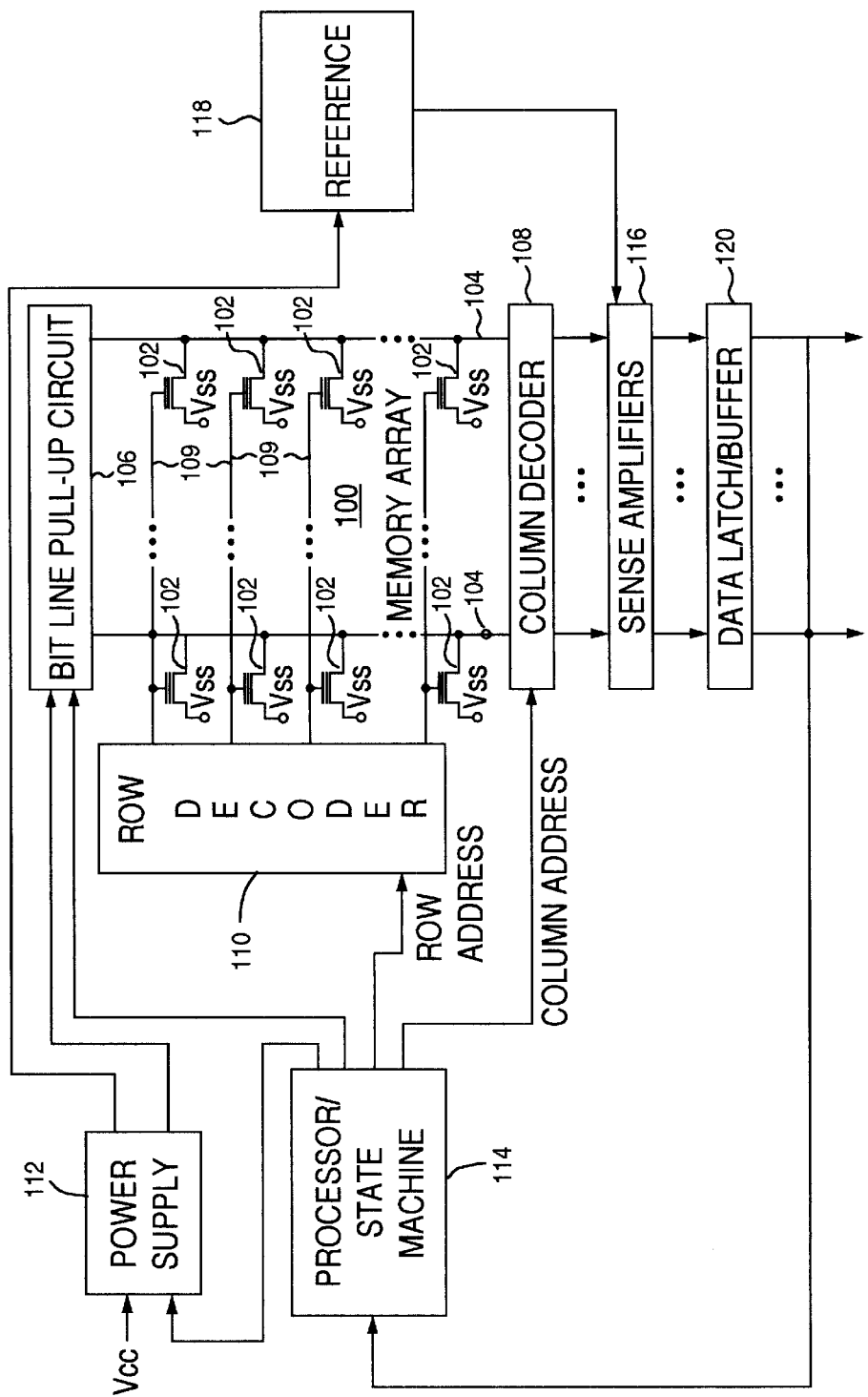
FIG. 1 Schematically illustrates an embodiment of an integrated circuit with a flash memory array that is programmed in a manner in accordance with the present invention.
Figure 2:
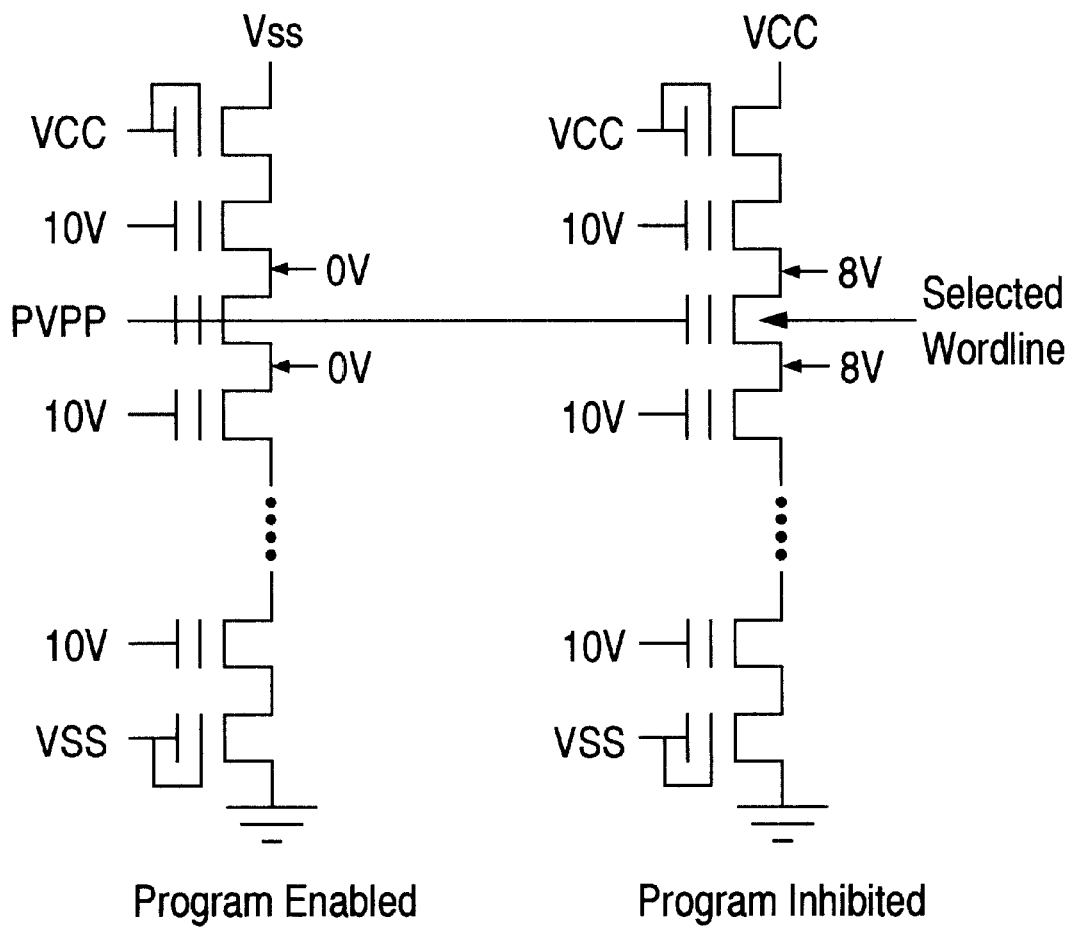
FIG. 2 schematically shows a known method of programming the flash memory array of FIG. 1.
Figure 3:
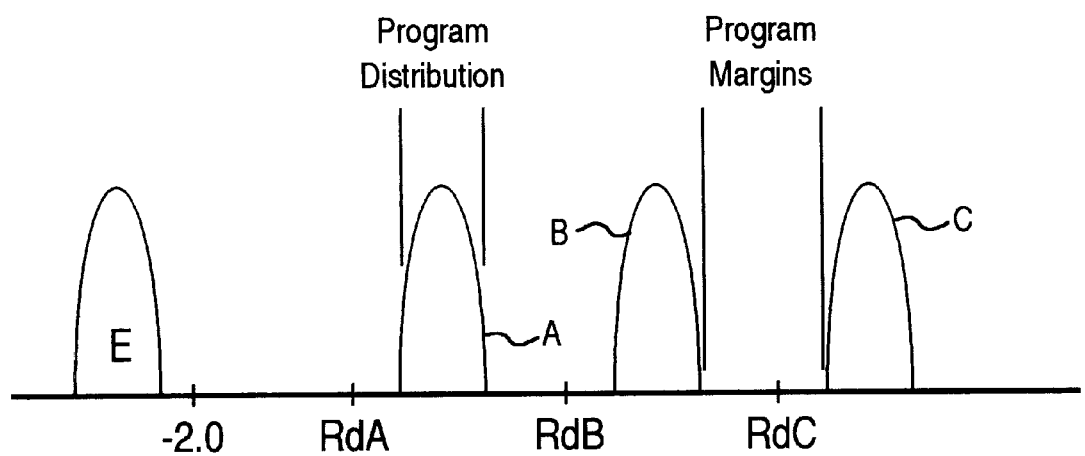
FIG. 3 schematically shows a known method of programming a multi-level cell used in the flash memory array of FIG. 1.
Figure 4:
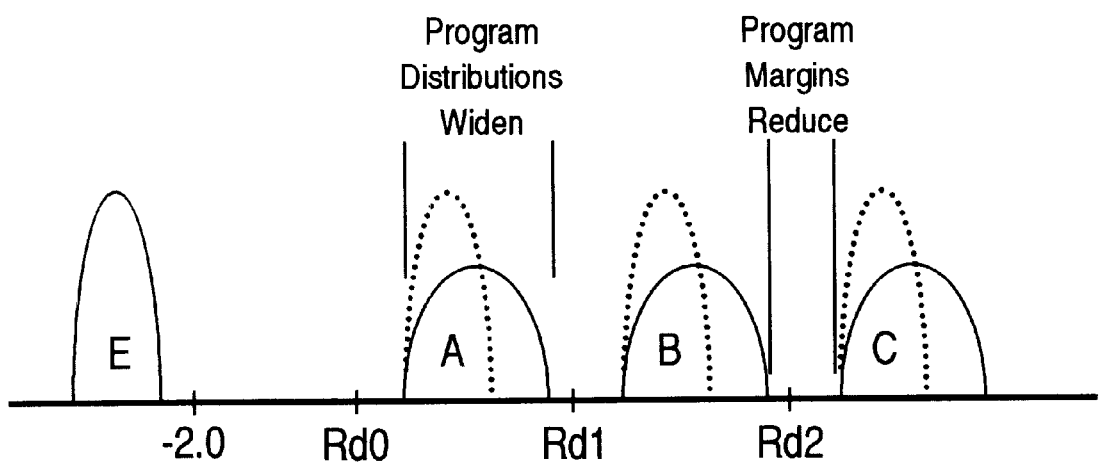
FIG. 4 illustrates the effect of faster programming on the program vt distribution shown in FIG. 3.
Figure 5:
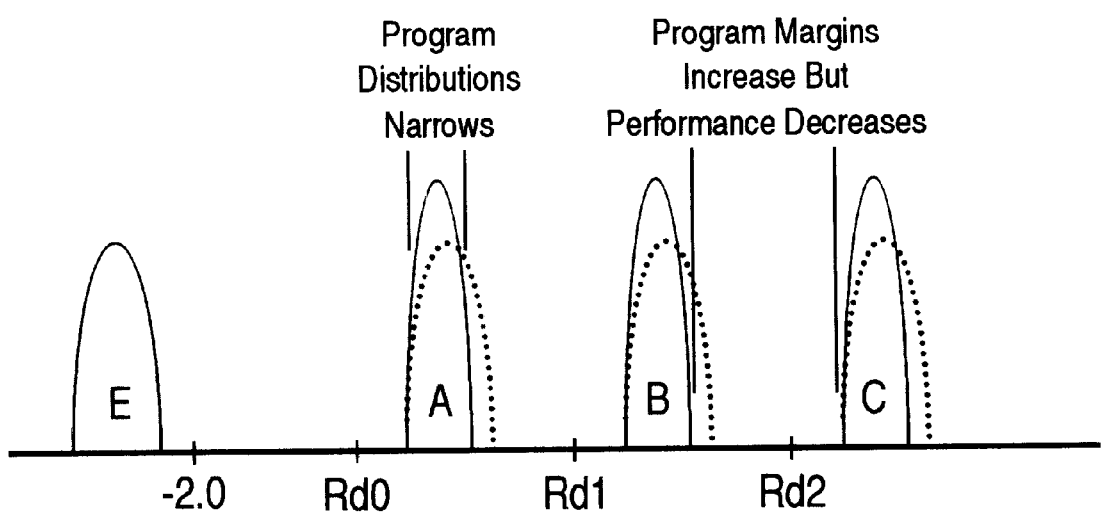
FIG. 5 illustrates the effect of slower programming on the program vt distribution shown in FIG. 3.

The following description of the method of the present invention will be with respect to the multi-level memory array 100 shown in FIG. 1. It should be understood that the present invention can be applied to other embodiments of memory structures as well.

Programming of the memory array 100 according to the present invention is accomplished by first programming the highest vt level with a number of pulses at one voltage, then programming the next lower level with a number of pulses at a lower voltage and continuing on until the next to lowest level is programmed.

Figure 6:
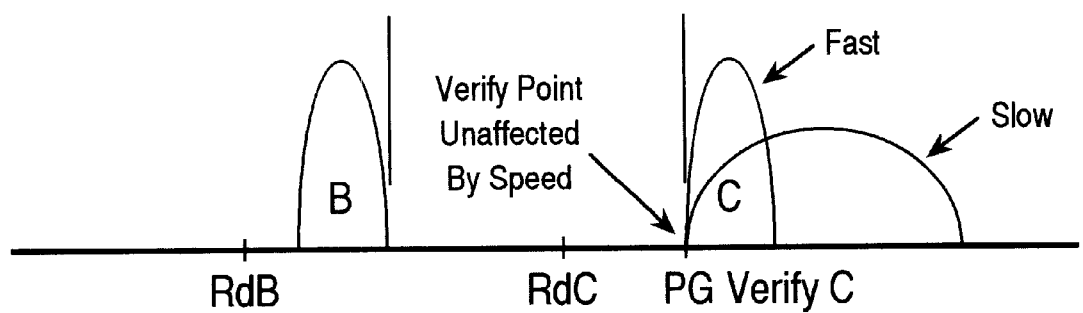
FIG. 6 illustrates a high level vt target window for both a fast and slow program distribution window for the program distribution shown in FIG. 3.

FIG. 6 illustrates a target window for high level C for both a fast and slow program distribution window. The point 300 indicates that the minimum program vt for the high level C is not related to program speed but the actual selected program verify level C. The location of point 300 is unaffected by program speed.

As described in U.S. patent application Ser. No. 09/779,764 entitled "Concurrent Program Reconnaissance With Piggyback Pulses For Multi-Level Cell Flash Memory Designs" by Allan Parker filed concurrently with the present application, program reconnaissance for multilevel cells is predicated on the immunity of the highest vt level program speed to effect program margins. By programming the highest vt level in its entirety first, the device can monitor and adjust program speed for successive lower vt states to insure desired accuracy. Regardless of whether the highest vt level programs fast or slow, the device can make the needed adjustments to tune future programming pulses. These actual adjustments are determined through device analysis. This analysis will indicate the program dependence between all levels and specific voltage characteristics. Thus, program reconnaissance is a methodology that allows variations in program distributions to be minimized by continuous adjustments of the program voltage.

While the above-described standard program reconnaissance will compensate for both fast and slow program variations, it requires that the highest vt level be programmed independently of the other vt levels. Removing the highest vt level from the ganged approach of piggyback programming where all levels are programmed as a unit will decrease the program performance.

Please note that in order to achieve the above programming one or more pulses are applied to each vt level separately. In the case of N=2, initially pulses of a voltage, such as 20V, are applied to the highest vt level C. After level C is programmed, one or more pulses of a voltage, such as 19V, are applied to the next lowest level B until level B is programmed. Next, one or more pulses of a lower voltage, such as 18V, are applied to the lowest level C until level C is programmed. Note that the voltages of the pulses are dependent on the desired speed of programming. Note that the highest vt level pulse is adjusted so that the selected bit cells will complete programming in ½ the pulse count of the successive vt levels. For example, if the pulse target is 10, the high vt level bits will be targeted for completion of programming in 5 pulses. If the high vt level programming speed increases (fewer pulses), the program voltage can be adjusted to slow successive level programming and insure proper distributions for the lower vt levels. Of course, other values for the voltages of the pulses are possible depending on the desired speed of programming.

Key to successful multi-level cell operation is controlled program vt distributions. Hump width and spacing must fall within target windows for correct data storage and long term reliability. To achieve this programming control, a specific program pulse target is usually required. For example, 10–15 $\mu$sec pulses can be used to program level within a 250 mv distribution. The program voltage will then be set to insure 10 pulses during level B programming. The applied program voltages are adjusted so that all vt levels complete programming after the targeted number of piggyback pulses 200. There are several setup and discharge concerns when applying the high voltage. Also the rise and fall times of the applied program pulse can be significant.

Concurrently with the above-described programming, program reconnaissance is performed in a manner similarly described in U.S. patent application Ser. No. 09,/779,764, entitled "Concurrent Program Reconnaissance With Piggyback Pulses For Multi-Level Cell Flash Memory Designs" by Allan Parker filed concurrently with the present application, the entire contents of which are incorporated herein by reference. Such concurrent program reconnaissance makes program adjustments after the highest level program is complete. The difference is that the highest-level program time will not track with the other vt levels.

According to the methodology of the present invention, programming of the memory cell 102 with the programming pulses 200 is accomplished by setting or determining a target number T of programming pulses for programming each of the $2^N$–1 vt levels of the multi-level memory cell 102. During programming, it is determined when the highest vt level is programmed. If it is determined that the highest vt level is programmed by a number M of programming pulses that is less than the target number T, then the programming speed for the highest vt level is too large. To compensate for this, the programming pulses subsequent to the Mth programming pulse and corresponding to the lower levels are altered so that their voltages are lowered so as to slow down the program time so that the lower levels will be programmed slower so that they are programmed by the targeted programming pulse.

Figure 7:
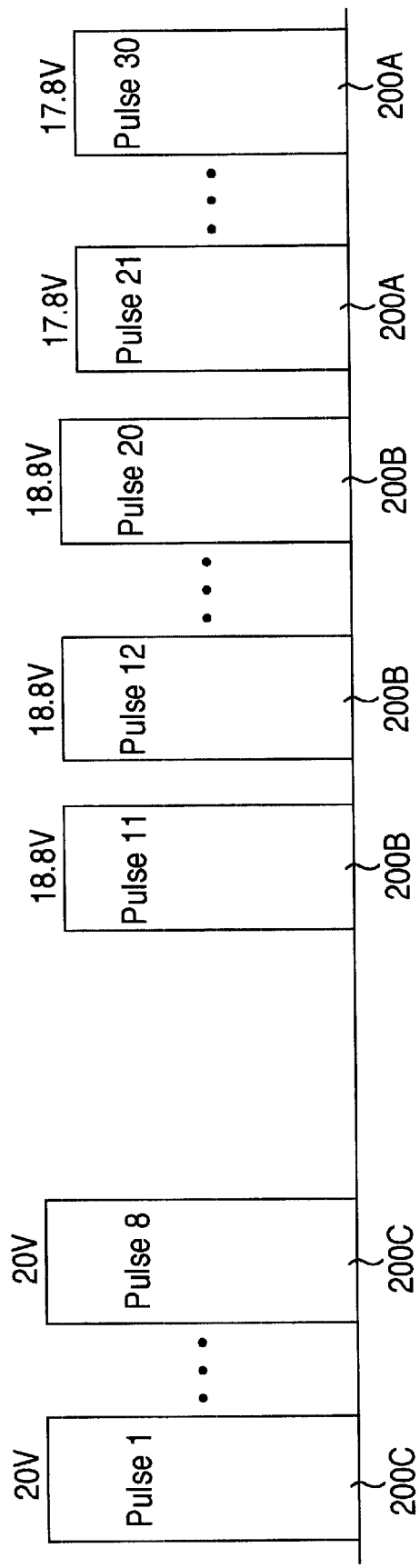
FIG. 7 schematically shows a mode of programming the flash memory array of FIG. 1.

FIG. 7 illustrates an example of concurrent programming and reconnaissance. In this example, a target of ten pulses has been set for the number of programming pulses 200 needed to program each of the $2^2-1=3$ vt levels of the N=2 bit multi-level memory cell 102. Thus, programming is targeted to be complete upon application of a total of thirty pulses, ten 20V pulses for programming level C, ten 19V pulses for programming level B and ten 18V pulses for programming level A. As shown in FIG. 7, the initial pulses 200C each has a voltage of 20 volts that corresponds to the vt value of level C. Thus, the initial pulses 200C program the level C data. During the application of the initial pulses 200C, the bit line corresponding to level C is the only bit line uninhibited and selected for programming. The bit-lines corresponding to levels A and B are inhibited.

Figure 8:
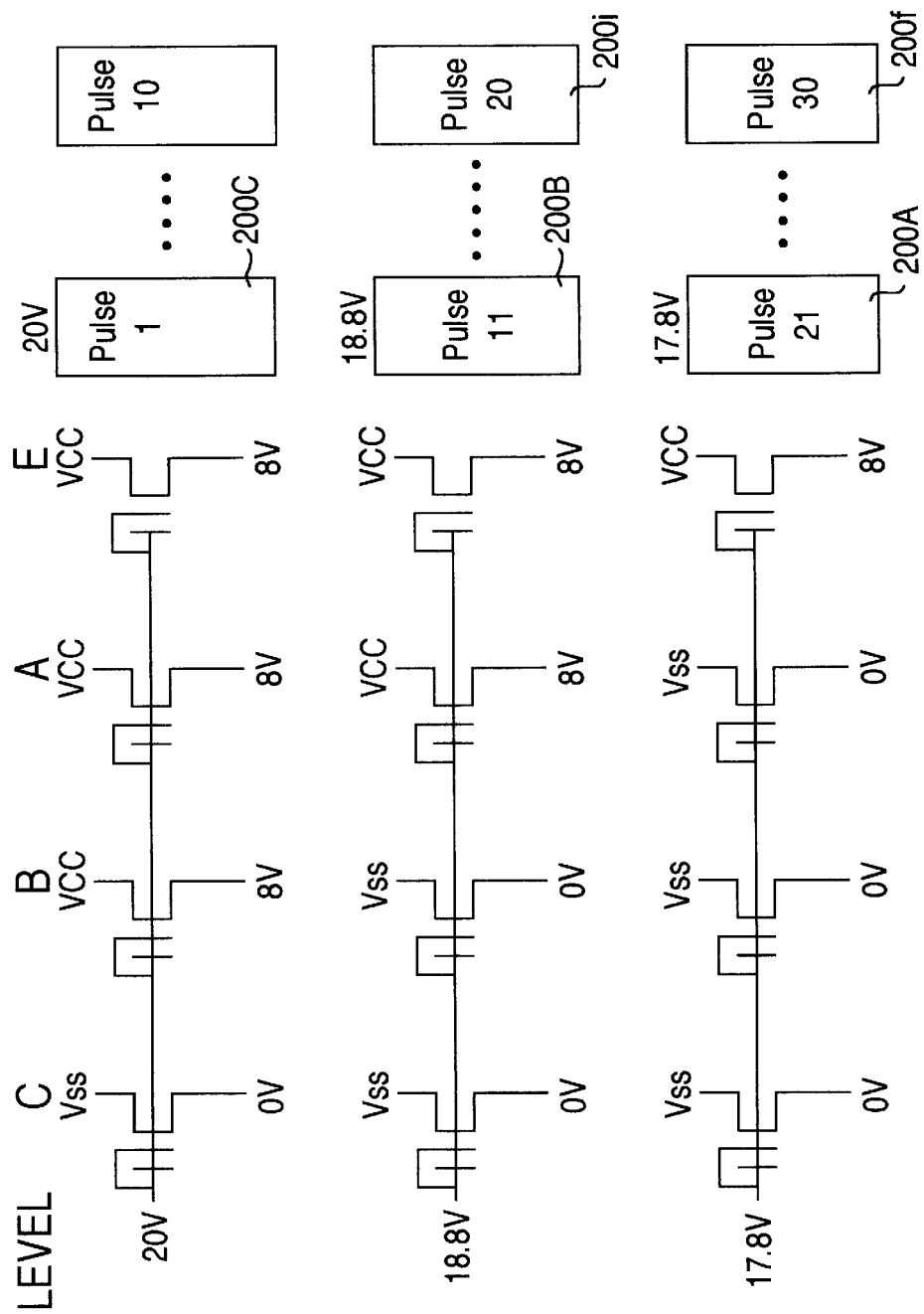
FIG. 8 schematically shows a mode of concurrent program reconnaissance in accordance with the present invention.

In the example shown in FIGS. 7 and 8, it is determined that the level C is programmed by eight of the pulses 200C instead of the target number of 10. Thus, the highest level is programmed at a rate 20% faster than targeted.

After, the eight pulses 200C are completed, a second set of pulses 200B is applied. To compensate for the high programming speed of level C, the subsequent programming pulses 200B and 200A have their voltages each lowered by 200 mV. Ten such altered programming pulses 200B having a voltage of 18.8V are applied to the memory cell. During application of the second set of pulses 200B, a voltage Vss is applied to the bit line corresponding to level B so as to drain charge. Only the level B cells are selected for programming during application of the second set of pulses 200B. During application of the second set of pulses 200B, the bit lines corresponding to level A, level C and the Erase State level are inhibited.

Upon completion of the ten pulses 200B, ten pulses 200A having a piggyback logic voltage of 17.8V are applied. During application of the third set of pulses 200A, the bit lines corresponding level A, level B and the Erase State level are inhibited.

The end result of the above described example as shown in FIG. 7 and the method according to the present invention is that each of the $2^N-1$ levels A–C are programmed at the desired target of ten programming pulses. After each pulse 200A–C is complete, the word-line and bit-line are discharged.

The highest vt level program pulse can be adjusted so that it can complete programming of the highest level C in ½ the number of pulses of successive states. If the highest level C programs fast, the pulses can be adjusted to slow down for other states so that the desired distribution is achieved. Adjustments for faster bits will insure tighter program margins by controlling the pulse count for successive VT states.

This combination allows for the program performance increase and maintains vt distribution control. The new methodology allows the device to maintain a specific program distribution maximum regardless of program variations in successive vt levels. Piggyback program reconnaissance also allows the highest vt level to retain information to adjust the program state to minimize margin variations.

Program reconnaissance maintains the performance of programming and allows adjustments to compensate for program speed increases. When the program speed increases, these adjustments will maintain the desired program vt distribution. Program distribution uniformity allows for a multi-level cell design with higher reliability.

The foregoing description is provided to illustrate the invention, and is not to be construed as a limitation. Numerous additions, substitutions and other changes can be made to the invention without departing from its scope as set forth in the appended claims. For example, programming according to the present invention is scaleable to all multi-level cell densities.

I claim:

1. A method of programming a memory cell that has $2^N$ voltage levels where N>1 and represents the number of bits stored within said memory cell, the method comprising:

setting a target number T of programming pulses for programming each of said $2^N-1$ vt levels of said memory cell;

applying $T*(2^N-1)$ programming pulses to said memory cell;

determining when the highest one of the $2^N-1$ vt levels is programmed; and if it is determined that the highest one of the $2^N-1$ vt levels is programmed by a number M of programming pulses that is less than the target number T, then compensating the programming speed of those ones of said $T*(2^N-1)$ number of programming pulses subsequent to said Mth programming pulse.

2. The method of claim 1, wherein said compensating comprises lowering a voltage of a said subsequent programming pulses.

3. The method of claim 2, wherein said compensating results in all of said $2^N-1$ vt levels lower than said highest one of the $2^N-1$ vt levels of said memory cell being programmed by said $T*(2^N-1)$ programming pulses.

4. The method of claim 1, wherein said memory cell comprises an EEPROM memory cell.

5. The method of claim 1, wherein said memory cell comprises a flash EEPROM memory cell.

6. A method of programming a multi-level cell flash memory array that comprises individual multi-level memory cells each having $2^N$ voltage levels where N>1 and represents the number of bits stored within said memory cell, wherein each of said individual memory cells comprises a drain connected to a bitline, a source connected to a voltage source Vss and a gate connected to a wordline, the method comprising:

setting a target number T of programming pulses for programming each of said $2^N-1$ vt levels of one of said individual multi-level memory cells;

uninhibiting only a bitline corresponding to a voltage level of said one of said individual multi-level memory cells;

applying $T*(2^N-1)$ piggyback pulses to said uninhibited bitline;

determining when the highest one of the $2^N-1$ vt levels is programmed; and if it is determined that the highest one of the $2^N-1$ vt levels is programmed by a number M of programming pulses that is less than the target number T, then compensating the programming speed of those ones of said $T*(2^N-1)$ number of programming pulses subsequent to said Mth programming pulse.

7. The method of claim 6, comprising inhibiting said uninhibited bitline by applying a voltage to the word line corresponding to said one of said individual multi-level memory cells.

8. The method of claim 6, wherein said uninhibiting comprises applying a voltage Vss to the bitline corresponding to the voltage level of said one of said individual multi-level memory cells to drain the charge away.

9. The method of claim 6, wherein said compensating comprises lowering a voltage of a portion of said subsequent piggyback programming pulses.

10. The method of claim 9, wherein said compensating results in all of said $2^N-1$ vt levels lower than said highest one of the $2^N-1$ vt levels of said memory cell being programmed by said $T*(2^N-1)$th piggyback programming pulse.

11. The method of claim 6, wherein said compensating results in all of said $2^N-1$ vt levels lower than said highest one of the $2^N-1$ vt levels of said memory cell being programmed by said $T*(2^N-1)$th piggyback programming pulse.

12. The method of claim 6, wherein said memory cell comprises an EEPROM memory cell.

13. The method of claim 6, wherein said memory cell comprises a flash EEPROM memory cell.

* * * * *